(12) United States Patent
Berriman et al.

(10) Patent No.: US 8,362,428 B2
(45) Date of Patent: Jan. 29, 2013

(54) TRANSMISSION ELECTRON MICROSCOPE

(75) Inventors: John Berriman, London (GB); Peter Rosenthal, London (GB)

(73) Assignee: Medical Research Council, London (GB)

( * ) Notice: Subject to any disclaimer, the term of this patent is extended or adjusted under 35 U.S.C. 154(b) by 349 days.

(21) Appl. No.: 12/668,267

(22) PCT Filed: Jun. 5, 2008

(86) PCT No.: PCT/GB2008/001920
§ 371 (c)(1),
(2), (4) Date: May 20, 2010

(87) PCT Pub. No.: WO2009/007668
PCT Pub. Date: Jan. 15, 2009

(65) Prior Publication Data
US 2010/0230591 A1    Sep. 16, 2010

(30) Foreign Application Priority Data

Jul. 9, 2007 (GB) .................. 0713276.4

(51) Int. Cl.
*G01N 23/00* (2006.01)
*G21K 7/00* (2006.01)
(52) U.S. Cl. ........ 250/311; 250/307; 250/309; 250/310; 250/396; 250/396 R; 250/396 ML; 250/443.1; 250/505.1
(58) Field of Classification Search .................. 250/307, 250/309–311, 398, 396 R, 396 ML, 443.1, 250/505.1
See application file for complete search history.

(56) References Cited

U.S. PATENT DOCUMENTS

| | | | |
|---|---|---|---|
| 4,663,525 A | 5/1987 | Ohtsuki et al. | |
| 4,843,330 A | 6/1989 | Golladay et al. | |
| 4,943,769 A | 7/1990 | Golladay et al. | |
| 4,992,661 A * | 2/1991 | Tamura et al. | 250/307 |
| 5,057,773 A | 10/1991 | Golladay et al. | |
| 5,396,067 A | 3/1995 | Suzuki et al. | |
| 2001/0036588 A1 | 11/2001 | Buschbeck et al. | |

(Continued)

FOREIGN PATENT DOCUMENTS

| | | |
|---|---|---|
| DE | 4305672 | 8/1994 |
| EP | 0417354 | 3/1991 |

(Continued)

OTHER PUBLICATIONS

Brink, et al., "Evaluation of Charging on Macromolecules in election Cryomicroscopy", Ultramicroscopy, 72 (1998), p. 41-52.

(Continued)

*Primary Examiner* — Nikita Wells
*Assistant Examiner* — Meenakshi Sahu
(74) *Attorney, Agent, or Firm* — Niels Haun; Dann, Dorfman, Herrell & Skillman, PC

(57) ABSTRACT

A transmission electron microscope has a target body position on the electron optical axis of the microscope, and an electrically conductive body off the axis of the microscope. The microscope also has an electron source for producing an axial electron beam. In use, the beam impinges upon a target body located at the target body position. The microscope further has a system for simultaneously producing a separate off-axis electron beam. In use, the off-axis electron beam impinges on the electrically conductive body causing secondary electrons to be emitted therefrom. The electrically conductive body is located such that the emitted secondary electrons impinge on the target body to neutralise positive charge which may build up on the target body.

11 Claims, 5 Drawing Sheets

U.S. PATENT DOCUMENTS

| | | |
|---|---|---|
| 2002/0011566 A1 | 1/2002 | Nagayama et al. |
| 2002/0148960 A1 | 10/2002 | Todokoro et al. |
| 2006/0060790 A1* | 3/2006 | Nakasuji et al. ........... 250/423 F |
| 2007/0138388 A1 | 6/2007 | Ward et al. |
| 2008/0067375 A1* | 3/2008 | Kasai et al. .................. 250/310 |

FOREIGN PATENT DOCUMENTS

| | | |
|---|---|---|
| JP | 2007165155 | 6/2007 |
| WO | 0129872 | 4/2001 |
| WO | 2006017252 | 2/2006 |
| WO | 2006133241 | 12/2006 |
| WO | 2007067296 | 6/2007 |

OTHER PUBLICATIONS

Warrington, "A Simple Charge Neutralizer for the Electron Microscope", J. Sci. Instrum., 43 (1966), p. 77-78.

Frost, "Image-Plane Off-Axis Electron Holography: Low-Magnification Arrangements", Meas. Sci. Technol., 10 (1999), p. 333-339.

International Search Report dated Oct. 31, 2008 from International Application No. PCT/GB2008/001920.

Written Opinion dated Oct. 31, 2008 from International Application No. PCT/GB2008/001920.

* cited by examiner

TRANSMISSION ELECTRON MICROSCOPE

RELATED APPLICATIONS

This application is a 371 application of International Application No. PCT/GB2008/001920 filed Jun. 5, 2008, which claims priority to United Kingdom Patent Application No. 0713276.4 filed Jul. 9, 2007. Each of the foregoing applications is hereby incorporated herein by reference.

The present invention relates to a transmission electron microscope.

When imaging non-conducting specimens by transmission electron microscopy (TEM), beam-induced positive charge builds up on the specimen due to the ejection of secondary electrons. Transmission images of such charged specimens are degraded due to (1) electrostatic perturbation of the imaging optics and (2) charge-induced movement and modification of the specimen. These problems are a major limitation to a wide variety of imaging experiments in biology and materials science, including the imaging of frozen-hydrated specimens by cryomicroscopy.

For specimens that are resistant to radiation damage by the imaging electron beam, images are often recorded after sufficient pre-exposure such that the positive charge build-up on the specimen reaches a steady-state because secondary electrons cannot escape the positive charge. For specimens that are not resistant to radiation damage, pre-exposure is not an option, because relevant structural details of the specimen must be recorded using the first few electrons that irradiate the specimen. Thus the charge on the specimen can change for the duration of the exposure. Image degradation by charging may be most problematic for cryomicroscopy of biological specimens precisely under imaging conditions that are otherwise most advantageous for imaging structural detail, such as when they are suspended in holes over ice, or at liquid helium temperature where specimen conductivity is reduced.

Brink et al., *Evaluation of charging on macromolecules in electron cryomicroscopy*, Ultramicroscopy, 72 (1998) 41-52 describes charge build up on non-conducting specimens due to secondary electron emission. In particular, an experiment is disclosed in which a small diameter beam is used to charge up a specimen, and a wide diameter beam is then used to observe the charged area and eventually discharge it. It is suggested that some of the secondary electrons which are emitted across the entire region when the specimen is examined with the wide beam return to compensate the built up positive charge.

Warrington, *A simple charge neutralizer for the electron microscope*, J. Sci. Instrum., 43 (1966) 77-78, proposes a charge neutralizer consisting of an earthed film of vacuum deposited carbon and aluminium supported above the specimen plane of the objective lens. The electron beam passes through the film before striking the specimen to be examined. Low energy electrons ejected from the film then discharge the non-conducting specimen.

Beam-induced positive charge can build up on other non-conducting bodies, such as electron optical elements, located on the path of the electron beam, and degrade their performance. Examples of such bodies are phase plates and electron biprisms.

US 2002/0011566 discloses an antistatic phase plate for use in phase-contrast electron microscopy, the phase plate being made of a thin film of conductive amorphous material.

Frost, *Image-plane off-axis electron holography: low-magnification arrangements*, Meas. Sci. Technol., 10 (1999) 333-339, discusses measurements of the deflection angle at an electron biprism which indicate that the biprism fibre is positively charged by the imaging electron beam.

The present invention aims to overcome or mitigate problems of beam-induced positive charge build up.

In a first aspect, the present invention provides a transmission electron microscope (TEM) having:

a target body position on the electron optical axis of the microscope, an electrically conductive body off the axis of the microscope, an electron source for producing an axial electron beam which, in use, impinges upon a target body located at the target body position, and a system for simultaneously producing a separate off-axis electron beam which, in use, impinges on the electrically conductive body causing secondary electrons to be emitted therefrom;

wherein the electrically conductive body is located such that the emitted secondary electrons impinge on the target body to neutralise positive charge which may build up on the target body.

As used herein, the term "separate off-axis electron beam" excludes any off-axis electron beam that may be produced by scattering or diffraction of the axial electron beam.

By producing, simultaneously with the axial electron beam, a separate off-axis electron beam that causes charge-neutralising secondary electrons to be emitted, the TEM can be used e.g. to image a non-conducting specimen while at the same time operating to reduce charge build-up on the specimen. In other words, the separate off-axis electron beam and the off-axis electrically conductive body may be thought of as a dedicated system for reducing or eliminating charge build-up. Advantageously, and in contrast to the observations of Brink et al. ibid., the TEM operator can image a specimen with a narrow-diameter beam and still avoid problems of beam-induced positive charge build up. Further, the inconvenience and disturbance of a charge neutralizer positioned in the path of the axial electron beam according to the proposal of Warrington ibid. can be avoided.

Preferably, the off-axis electrically conductive body is located adjacent to the target body position. The secondary electrons emitted from the body will then have a relatively short distance to travel before impinging on the target body, which can increase the flux of impinging electrons.

Preferably, the off-axis electron beam is a paraxial electron beam. A paraxial electron beam can be defined as a beam that is focusable onto the electron optical axis by the TEM lenses, but has a minimum divergence angle that is greater than the maximum divergence angle of the axial electron beam.

Conveniently, the off-axis electron beam can be produced by the same electron source that produces the axial electron beam, i.e. the system for simultaneously producing a separate off-axis electron beam can include the electron source. Advantageously, using this approach, a conventional TEM can readily be converted into a TEM according to the present invention.

For example, the system for producing an off-axis electron beam may comprise an aperture body positioned between the electron source and the target body position, the aperture body having an axial aperture for transmission of the axial electron beam and further having an off-axis aperture for production of the off-axis electron beam. Such an aperture body may simply replace an existing condenser aperture body of an existing TEM.

The system for producing an off-axis electron beam may produce a plurality of such beams which, in use, impinge on the electrically conductive body (or, more preferably, respective electrically conductive bodies). This makes it possible, for example, to neutralise build up of positive charge at respective target bodies at spaced positions on the electron optical axis position. Thus, the aperture body may have a plurality of off-axis apertures for production of respective off-axis electron beams, each off-axis electron beam, in use, impinging on the off-axis electrically conductive body or a respective off-axis electrically conductive body.

Typically, the TEM has at least one condenser lens between the electron source and the target body position, and the aperture body may be positioned between the condenser lens and the target body position. Thus the aperture can limit the illuminating field of the condenser lens.

Indeed, in a further aspect, the present invention provides a multi-aperture aperture body as discussed above.

In other embodiments of the first aspect, the system for producing an off-axis electron beam may comprise a further electron source (or a plurality of further electron sources if a plurality of off-axis electron beams are to be deployed). This can increase the complexity and cost of the TEM, and may make it more difficult to convert a conventional TEM into a TEM according to the present invention. However, a further electron source for producing the off-axis electron beam can provide an advantage by allowing the off axis beam intensity to be varied independently of the axial beam, or for the off-axis beam to remain constant if the axial beam is pulsed.

Typically, the target body position is a specimen position, the axial electron beam, in use, impinging upon a specimen, and the emitted secondary electrons impinging on the specimen to neutralise positive charge which may build up on the specimen. Conveniently, the off-axis electrically conductive body can then be provided by a specimen support which holds the specimen at the specimen position.

However, the target body, or one of the target bodies, can be an electron optical element such as a phase plate or an electron biprism. In such cases the axial beam will typically impinge on a specimen, and that specimen may be another target body. When there are plural target bodies, each may have a respective electrically conductive body.

Embodiments of the invention will now be described by way of example with reference to the accompanying drawings in which.

Figure 6:
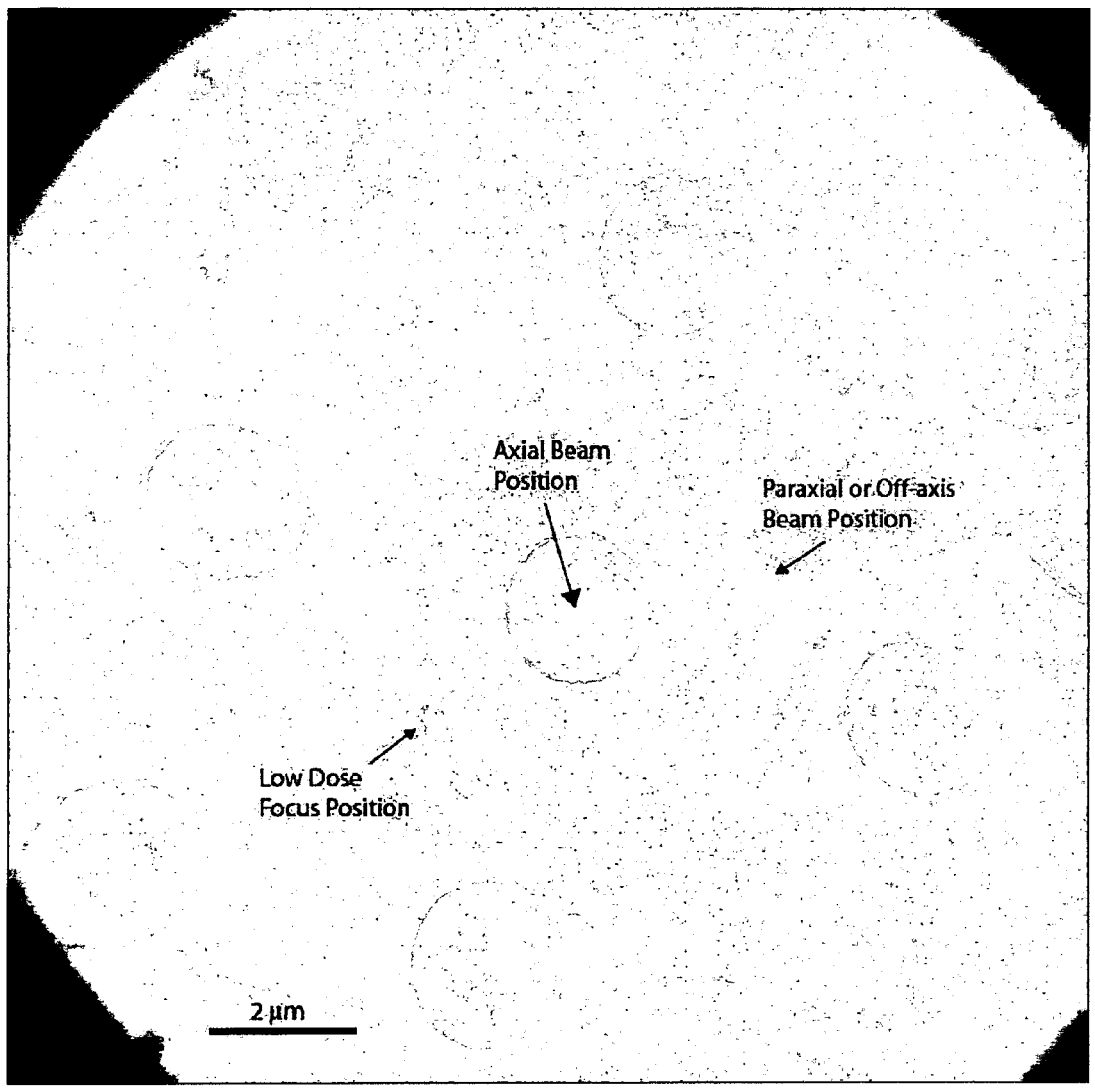
Figure 7:
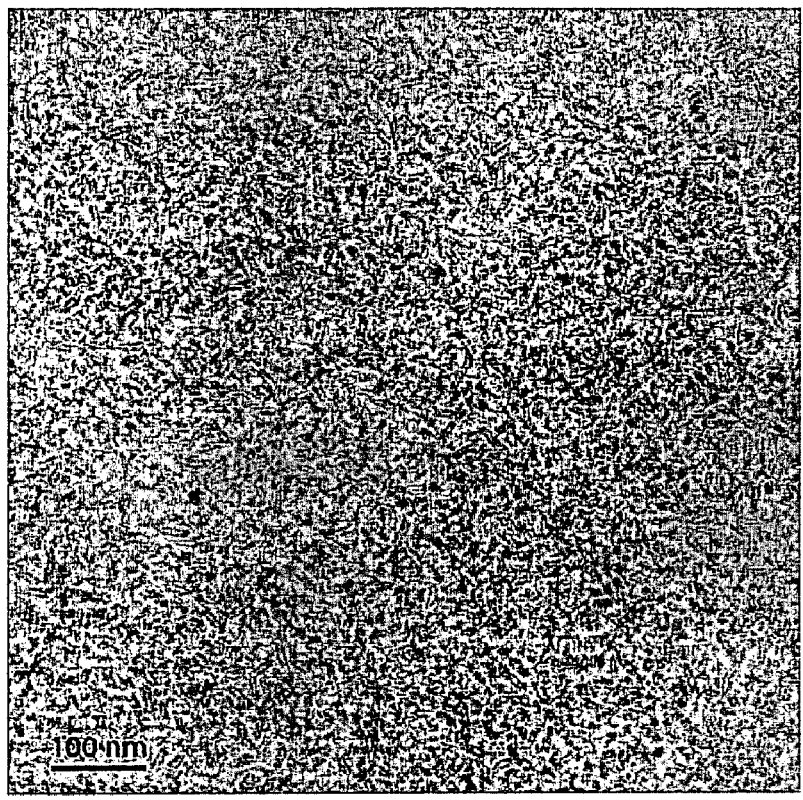
Figure 7:
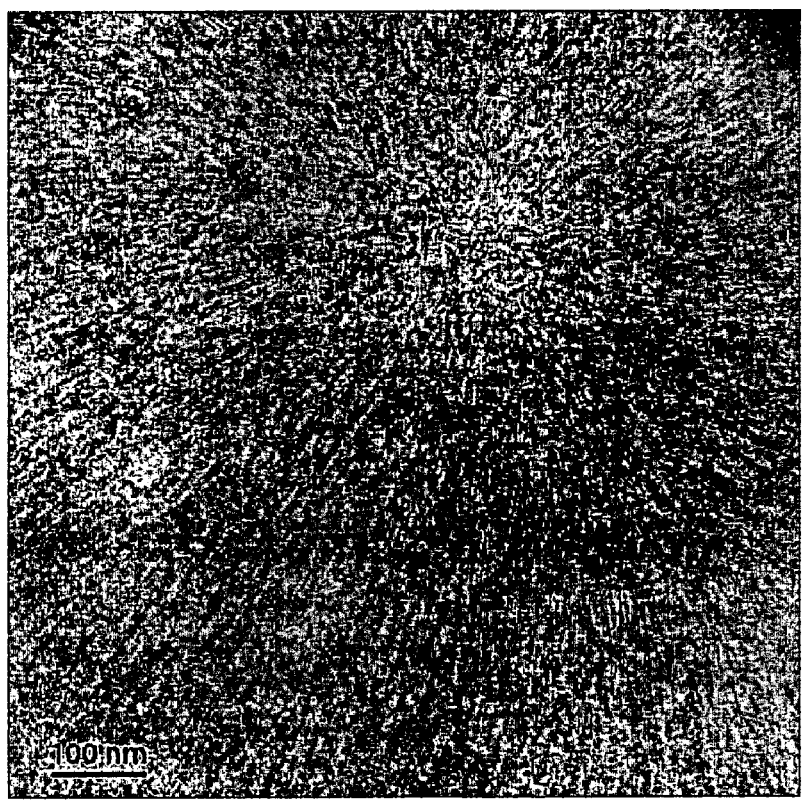

FIG. 6 is a recording on a CCD camera of a typical beam-sensitive (frozen-hydrated) specimen with the positions of beams indicated for imaging of a specimen using the seven-hole aperture; and FIG. 7 shows two images of the same area of a typical single particle specimen in vitreous ice over a hole in a carbon support (a) with the seven-hole aperture used as a charge compensator and (b) without the compensator.

Figure 1:
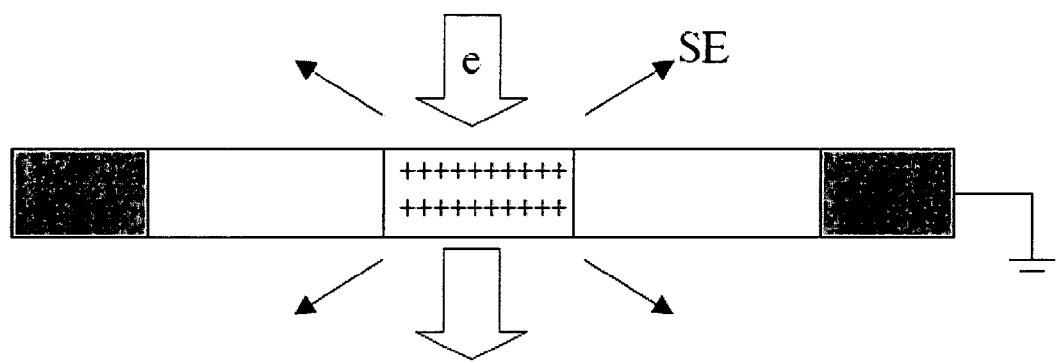
FIG. 1 shows schematically a non-conducting specimen, and a TEM axial electron beam used to image the specimen.

FIG. 1 shows schematically a non-conducting specimen, and a TEM axial electron beam (block arrows, e) used to image the specimen. The electron beam causes secondary electrons (line arrows, SE) to be ejected from the specimen, leaving the specimen with a positive charge. This positive charge can cause electrostatic perturbation of the imaging optics and also can cause movement and Coulombic explosion of the specimen.

Figure 2:
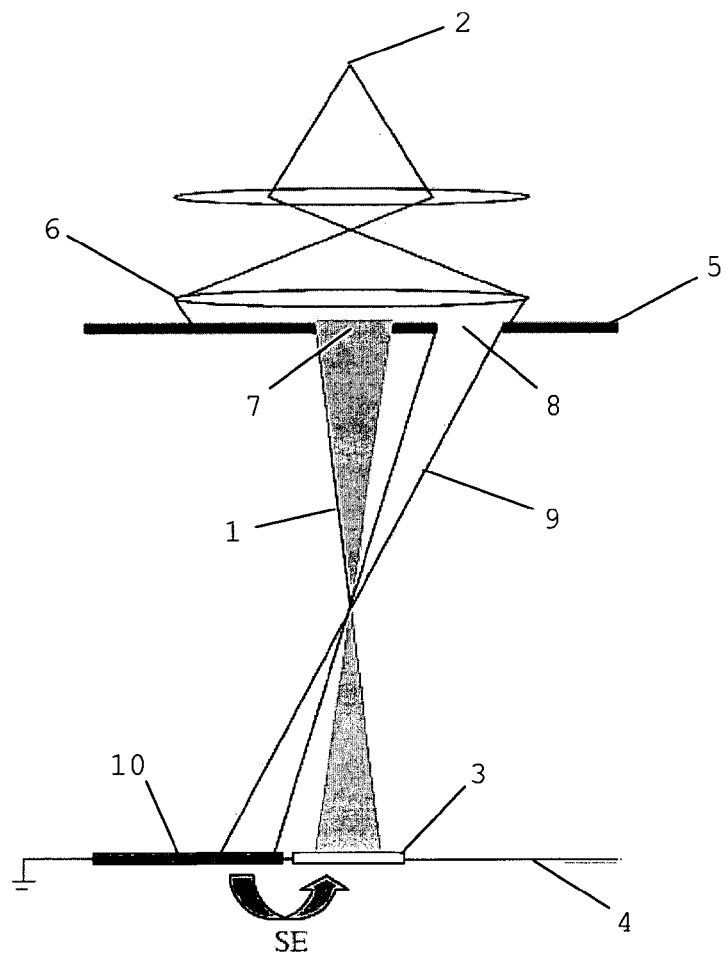
FIG. 2 shows schematically a longitudinal section through a TEM according to an embodiment of the invention.

FIG. 2 shows schematically a longitudinal section through a TEM according to an embodiment of the invention. An axial electron beam 1 produced by an electron source 2 impinges on a non-conducting specimen 3 held by specimen holder 4. A multi-hole aperture 5 positioned between TEM condenser lens 6 and the specimen has a central hole 7 for the axial electron beam and an off-centre hole 8 which produces a paraxial electron beam 9.

The paraxial electron beam irradiates a grounded conductor 10 which is adjacent the specimen but off the axis of the TEM, the grounded conductor being integral with the specimen holder. The irradiation of the paraxial electron beam causes secondary electrons SE to be emitted by the grounded conductor, and some of these electrons in turn impinge on the non-conducting specimen to neutralise positive charge which has built up on the specimen. Thus the paraxial beam and the grounded conductor act as charge compensator for the specimen.

A similar arrangement (not illustrated) can be used to neutralise positive charge on other bodies, such as a phase plate or an electron biprism, which are susceptible to charge build up due to secondary electron emission.

Figure 3:
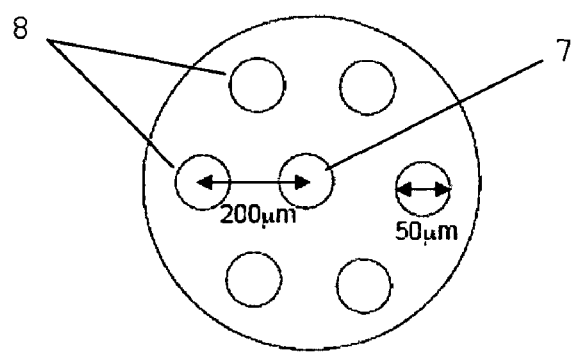
FIG. 3 shows schematically a multi-hole aperture.

FIG. 3 shows schematically a multi-hole aperture as viewed along the optical axis of a TEM. The aperture has a central hole 7 and six off-centre holes 8 circumferentially spaced around the central hole. Each off-centre hole can produce a respective paraxial beam. A typical diameter for the holes could be about 50 μm and typical centre-to-centre spacing for the holes could be about 200 μm. Such an aperture could be retrofitted to an existing microscope to allow it to produce several off-axis paraxial beams.

Figure 4:
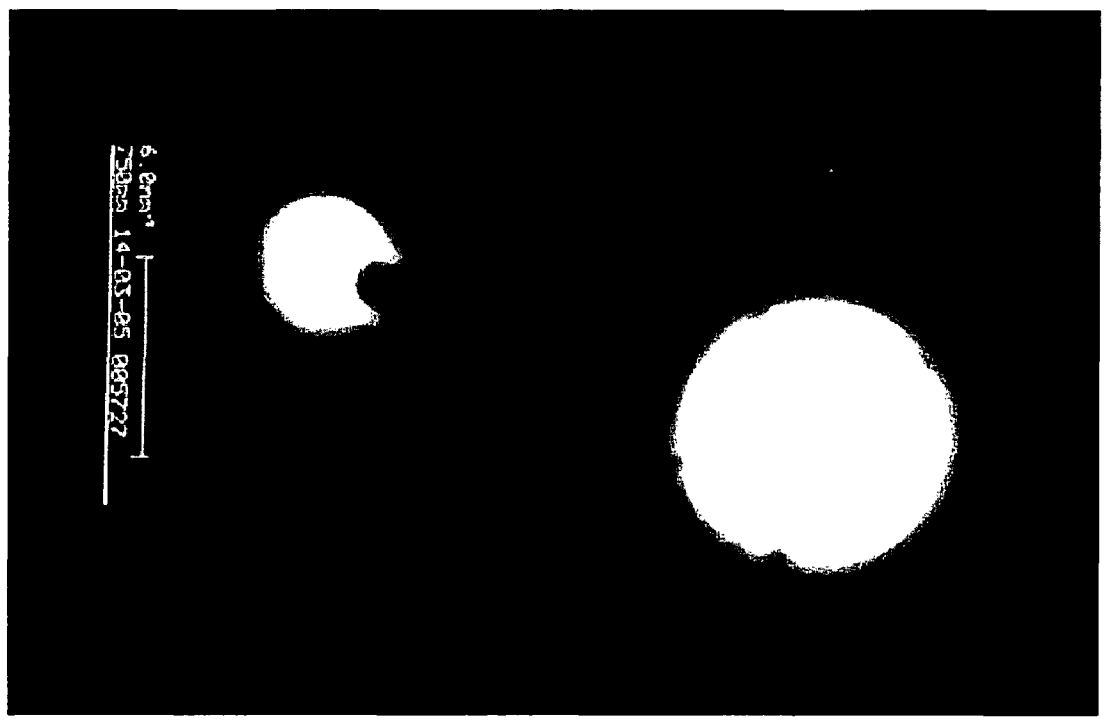
FIG. 4 is a recording on film of axial and paraxial electron beams.

FIG. 4 is a recording on film of the axial and paraxial electron beams produced using a condenser aperture having a 50 μm diameter central hole and one 100 μm diameter off-centre hole.

Figure 5A:
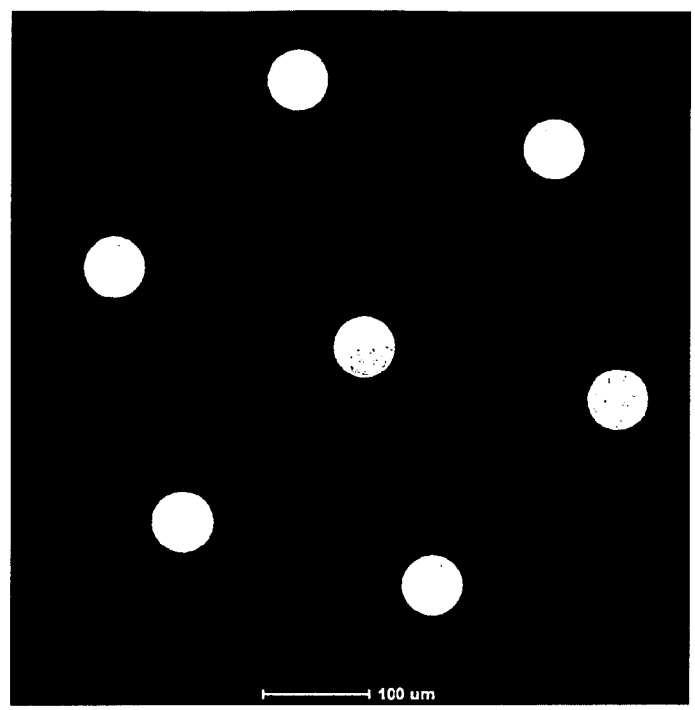
FIG. 5(a) is an image of a seven-hole condenser aperture.

FIG. 5(a) is an image recorded on a CCD camera of a seven-hole condenser aperture according to an embodiment of the present invention. The image was produced by placing the seven-hole aperture in the specimen holder of the electron microscope. Each hole is 50 μm diameter and the offset is 200 μm centre-to-centre.

Figure 5B:
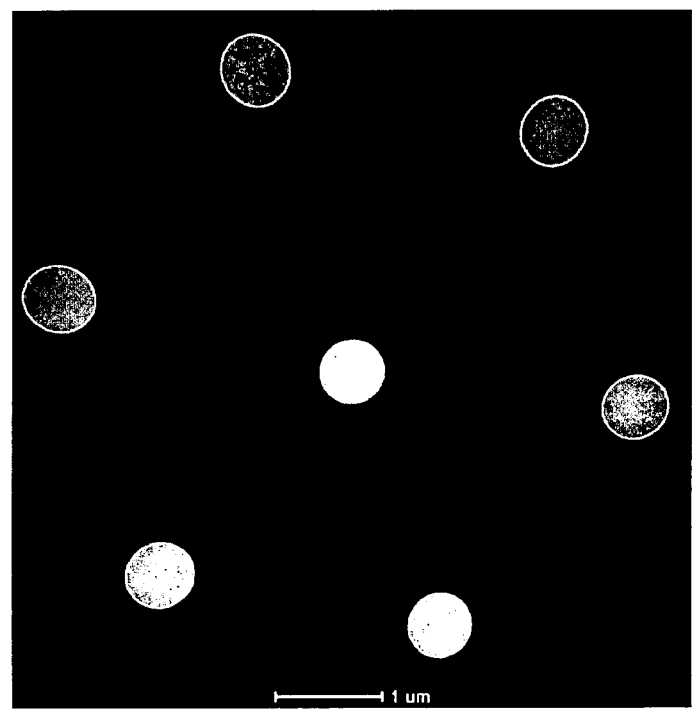
FIG. 5(b) is an electron microscope recording on a CCD camera of electron beams produced by the seven-hole aperture designed.

FIG. 5(b) is an electron microscope recording on a CCD camera of electron beams produced by the seven-hole aperture. The aperture is arranged to produce axial and paraxial beams on the specimen. The condenser lens demagnifies the image of the apertures onto the specimen plane. The paraxial beams are slightly elliptical compared to the axial beam due to spherical aberration of the condenser lens system.

FIG. 6 is a recording on a CCD camera of a typical beam-sensitive (frozen-hydrated) specimen with the positions of beams indicated for imaging of a specimen using the seven-hole aperture. If a single hole aperture is required in place of the seven-hole aperture, both apertures can mounted on the microscope aperture holder so that one or the other can be shifted into position as needed. Alternatively, an extra occluding aperture could be inserted to obstruct the paraxial beams.

The imaging protocol consisted of the identification of a region of interest in the specimen at low magnification (e.g. 10K times) using single beam illumination, focus determination by imaging the support adjacent to the specimen at a high magnification (e.g. 200K times) using single beam illumination, and then image recording of the region of interest at intermediate magnification (e.g. 60K times with focus parameters established during focus mode) using either the single or the seven-hole aperture. In this way the pre-exposure of the region of interest is minimized. The specimen is a holey carbon film covered with a thin film of vitreous ice containing material of interest at liquid nitrogen temperature (−195° C.). The region of interest is material located in the ice film over any of the holes. As FIG. 6 shows, in this case the axial beam position is within a hole.

FIG. 6 shows a low magnification image recorded subsequent to focusing and exposure. The focus position is 2 μm away from the axial beam position and can be identified as a bright spot where the concentrated dose has removed a layer of ice from the carbon. The position of the six off-axis beams on the surrounding carbon is also indicated. They produce a characteristic charging "footprint" in the overlying ice (Brink et al. ibid.). Irradiation of the carbon support at the paraxial beam positions causes SE electrons to impinge on the axial beam position located at the thin film of ice over the hole in the carbon support.

FIG. 7 shows two images of the same area of a typical single particle specimen in vitreous ice over a hole in a carbon support (a) with the seven-hole aperture used as a charge compensator and (b) without the compensator. In each case the axial beam was within the hole and did not irradiate the adjacent carbon support. In image (a) the paraxial beams from the compensator irradiated the adjacent carbon support. These beams were absent in image (b). The reduced image quality in the absence of the compensator (image (b)) is attributed to charging of the film resulting in image blurring and distortion by the mechanisms described above.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A transmission electron microscope having:
   a target body position on the electron optical axis of the microscope,
   an electrically conductive body off the axis of the microscope,
   an electron source for producing an axial electron beam which, in use, impinges upon a target body located at the target body position, and
   a system for simultaneously producing a separate off-axis electron beam which, in use, impinges on the electrically conductive body causing secondary electrons to be emitted therefrom;
   wherein the electrically conductive body is located such that the emitted secondary electrons impinge on the target body to neutralise positive charge which may build up on the target body, and
   wherein the system for producing an off-axis electron beam comprises an aperture body positioned between the electron source and the target body position, the aperture body having an axial aperture for transmission of the axial electron beam and further having an off-axis aperture for production of the off-axis electron beam.

2. A transmission electron microscope according to claim 1, wherein the off-axis electron beam is a paraxial electron beam.

3. A transmission electron microscope according to claim 1, wherein the off-axis electrically conductive body is located adjacent the target body position.

4. A transmission electron microscope according to claim 1, wherein the aperture body has a plurality of off-axis apertures for production of respective off-axis electron beams, each off-axis electron beam, in use, impinging on the off-axis electrically conductive body or a respective off-axis electrically conductive body.

5. A transmission electron microscope according to claim 1, further having at least one condenser lens between the electron source and the target body position, the aperture body being positioned between the condenser lens and the target body position, the aperture body limiting the illuminating field of the condenser lens.

6. A transmission electron microscope according to claim 1, wherein the system for producing an off-axis electron beam comprises a further electron source.

7. A transmission electron microscope according to claim 1, wherein:
   the target body position is a specimen position,
   the axial electron beam, in use, impinges upon a specimen, and
   the emitted secondary electrons impinge on the specimen to neutralise positive charge which may build up on the specimen.

8. A transmission electron microscope according to claim 7, wherein the off-axis electrically conductive body is provided by a specimen support which holds the specimen at the specimen position.

9. A transmission electron microscope according to claim 1, wherein:
   the target body position is a phase plate position,
   the axial electron beam, in use, impinges upon a phase plate, and
   the emitted secondary electrons impinge on the phase plate to neutralise positive charge which may build up on the phase plate.

10. A transmission electron microscope according to claim 1, wherein:
    the target body position is an electron biprism position,
    the axial electron beam, in use, impinges upon an electron biprism, and
    the emitted secondary electrons impinge on the electron biprism to neutralise positive charge which may build up on the electron biprism.

11. A transmission electron microscope according to claim 1, having a plurality of target body positions spaced on the electron optical axis of the microscope, a plurality of respective electrically conductive bodies off the axis of the microscope, and a system for simultaneously producing a plurality of separate off-axis electron beams which, in use, respectively impinge on the electrically conductive bodies.

* * * * *